United States Patent [19]

Grummett

[11] Patent Number: 4,682,723

[45] Date of Patent: Jul. 28, 1987

[54] MASK FOR WAVE SOLDERING MACHINE

[75] Inventor: Dennis W. Grummett, Kitchener, Canada

[73] Assignee: NCR Corporation, Dayton, Ohio

[21] Appl. No.: 874,759

[22] Filed: Jun. 16, 1986

[51] Int. Cl.⁴ .............................................. B23K 3/00
[52] U.S. Cl. ...................................... 228/39; 228/37
[58] Field of Search ................. 228/39, 54, 57, 180.1, 228/37; 118/301, 406, 504

[56] References Cited

U.S. PATENT DOCUMENTS

| | | | |
|---|---|---|---|
| 3,809,011 | 5/1974 | Fabre et al. | 118/301 |
| 4,311,266 | 1/1982 | Kondo | 228/180.1 |
| 4,420,110 | 12/1983 | McCullough et al. | 228/54 |
| 4,421,265 | 12/1983 | Boyer et al. | 228/39 |
| 4,457,466 | 7/1984 | Ahmann et al. | 228/57 |
| 4,566,624 | 1/1986 | Comerford | 228/180.1 |
| 4,614,294 | 9/1986 | Weaver | 228/57 |

OTHER PUBLICATIONS

Solders and Soldering, Construction Materials for Solder Equipment, p. 225, ©1964, by Howard H. Manko.

Primary Examiner—M. Jordan
Attorney, Agent, or Firm—Wilbert Hawk, Jr.; Albert L. Sessler, Jr.; Elmer Wargo

[57] ABSTRACT

A soldering mask for use with a wave soldering machine. The soldering mask is formed into a trough-like shape which is positioned in the machine to displace molten solder away from the part of the work which is not to be soldered. The mask is made of titanium and includes positioning members to accurately position the mask between the part to be free of solder and the wave of molten solder.

12 Claims, 4 Drawing Figures

MASK FOR WAVE SOLDERING MACHINE

BACKGROUND OF THE INVENTION

This invention relates, generally, to a wave soldering machine which is used to solder electrical components to a printed circuit board as the circuit board is moved through a wave of molten solder, and particularly, this invention relates to a mask which is used with such a wave soldering machine.

During the manufacture of printed circuit boards, for example, electrical components are placed, generally, on such a board with the associated conductor leads of the components passing through "plated through" holes within the printed circuit board. The leads which are passed through the holes are clipped to a short length, and the printed circuit board is inserted in a wave soldering machine for soldering.

The wave soldering machine includes a soldering station and a transport mechanism for moving the circuit board to be soldered from the entrance to the machine to the soldering station therein. Flux applicators and heaters are directed at the circuit board to prepare it for soldering as it is moved towards the soldering station.

The soldering is effected at the soldering station by moving the underside of the circuit board (with the clipped leads slightly extending) through a wave of molten solder. The "wave" is like water pouring over a waterfall. Thereafter, the soldered circuit board is removed from the machine.

For certain applications, it is desirable to have certain elements of the printed circuit board remain free of solder as the board is moved through the wave of molten solder. One prior-art way of accomplishing this is to tape the elements to remain solder-free prior to placing the printed circuit board into the machine. Elements like the gold, plug-in contacts on a printed circuit board, for example, are taped to remain solder-free. This method is time consuming in both applying and removing the tape, and in addition, the tape itself is expensive.

SUMMARY OF THE INVENTION

An object of this invention is to provide a low-cost apparatus and method which eliminate the taping operation mentioned and which provide a relatively safe operation for an operator who has to adjust the apparatus to accommodate different styles or sizes of printed circuit boards.

In a preferred embodiment of this invention, the apparatus includes a soldering station having means for presenting a wave of molten solder for soldering operations and transporting means for transporting work to be soldered along a feeding line into operative contact with the wave of molten solder.

The work has at least one portion which is to be free of operative contact with the wave of molten solder as the work is moved through the soldering station by the transporting means. The apparatus also includes a soldering mask and positioning means for positioning the soldering mask between the wave of molten solder and the one portion of the work.

The soldering mask has a general trough-like shape which displaces the wave of molten solder to enable the one portion of the work to be moved through the soldering station free of operative contact with the wave of molten solder.

The advantages and features of this invention will be more readily understood in connection with the following description, claims, and drawing.

DETAILED DESCRIPTION OF THE INVENTION

Figure 1:
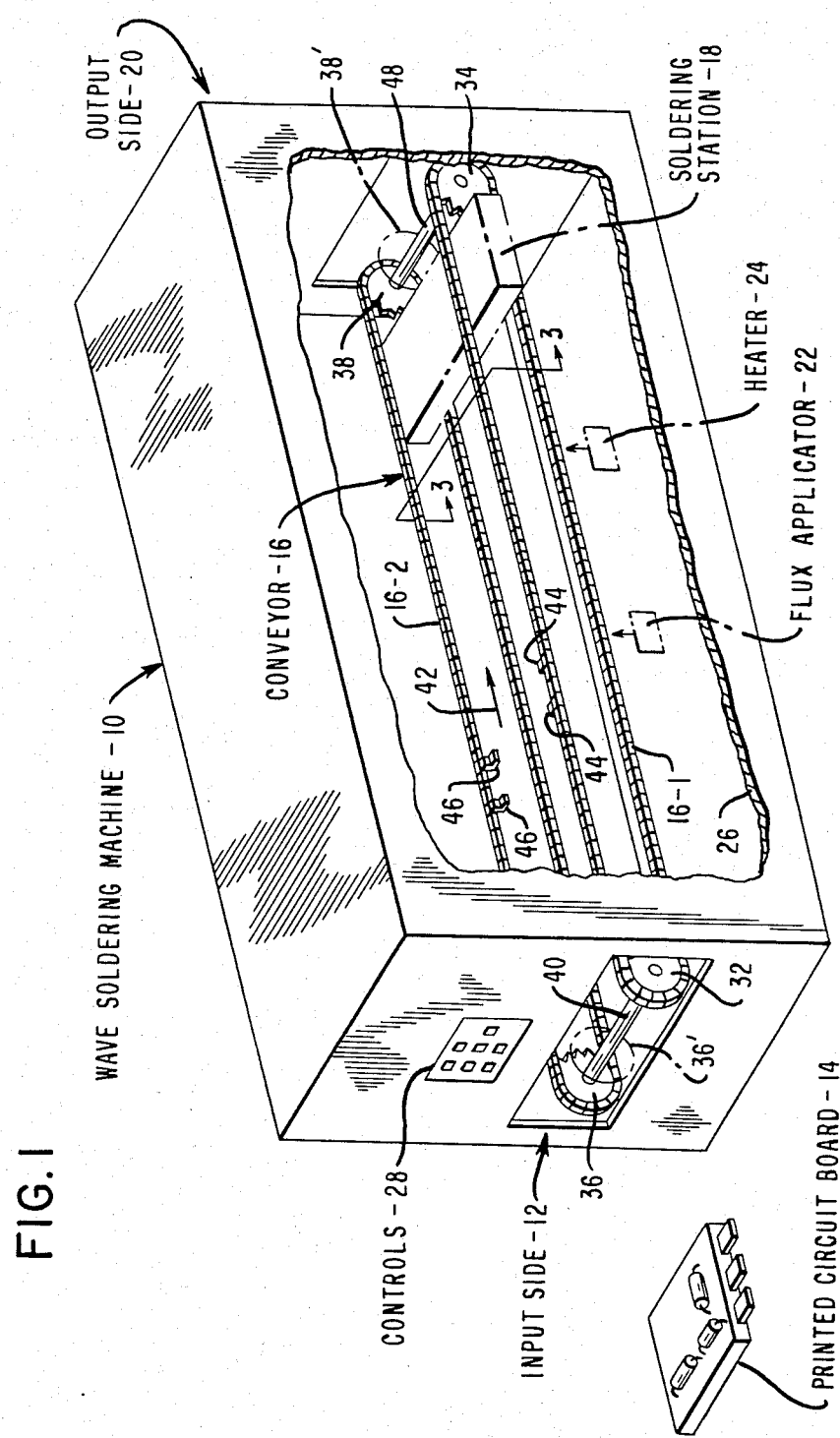
FIG. 1 is a diagrammatic view, in perspective, of a wave soldering machine showing the general components included in the machine.

FIG. 1 shows a diagrammatic view, in perspective, of a wave soldering machine 10 in which this invention is incorporated. The machine 10 includes an input side 12 where work to be soldered, like a printed circuit board 14, is inserted into the machine 10. The circuit board 14 is positioned on a conveyor, designated generally as 16, which moves the circuit board 14 from the input side 12 to the soldering station 18, and thereafter, the circuit board 14 is moved out of the machine 10 through the output side 20 to post-soldering operations, like cleaning, for example, not important to an understanding of this invention. During the transit from the input side 12 to the soldering station 18, the circuit board 14 passes over a flux applicator 22 which applies the appropriate soldering flux to the underside of the circuit board 14. Just prior to reaching the soldering station 18, the circuit board 14 is heated by a heater 24 to facilitate the soldering operation. The machine 10 has side access panels, shown only as opening 26, to check on the progress of the work through the machine 10, and to reach the interior of the machine 10 for making any adjustments thereto and for re-aligning circuit boards 14 on the conveyor should they become misaligned during transit. A control board 28, including conventional control circuits, is used to control the operation of the machine 10.

Figure 2:
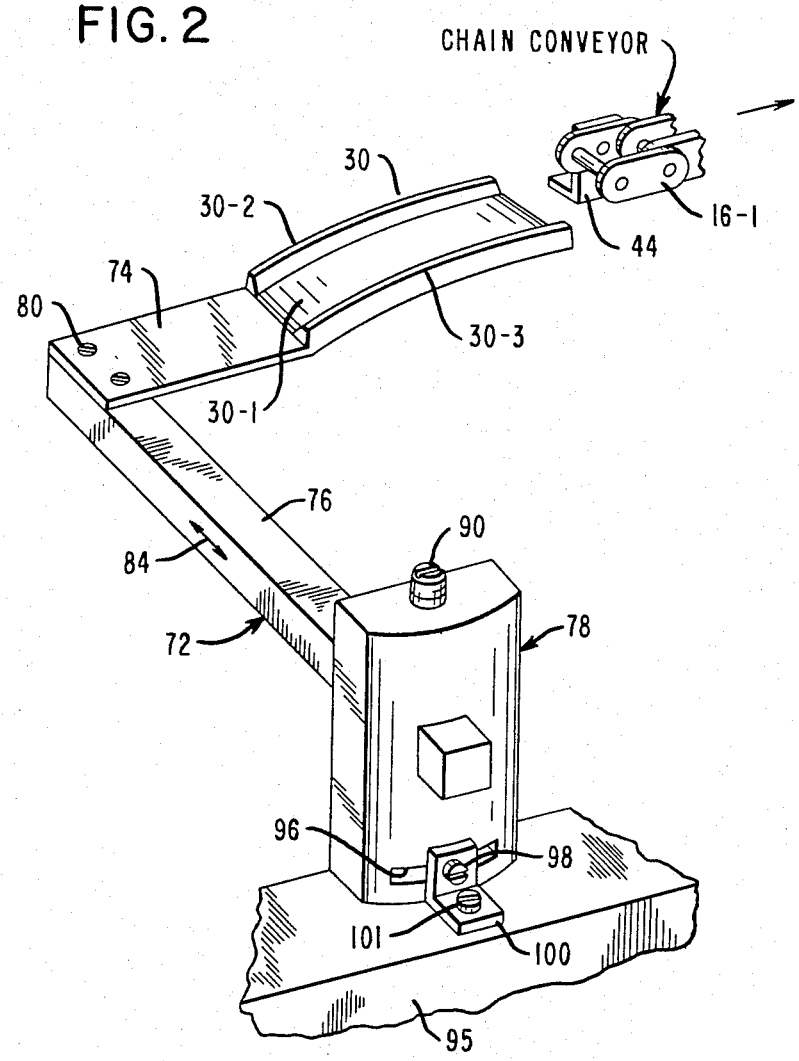
FIG. 2 is a general, perspective view of the apparatus of this invention as it is oriented relative to one of the chains associated with the conveyor included in the machine.

The wave soldering machine 10 made according to this invention includes the soldering mask designated generally as 30 which is shown in perspective in FIG. 2. In general operation, the soldering mask 30, which has a generally trough-like shape, displaces the wave of molten solder from the portion of the work which is not to be soldered as the work is brought into operative contact with the wave of molten solder. In order to orient the soldering mask 30 within the machine 10, it is necessary to discuss some additional details of the machine.

In this regard, the conveyor 16 (FIG. 1) is comprised of a right endless chain 16-1 which is mounted on drive pulley 32 and idler pulley 34, and similarly, a left endless chain 16-2 is mounted on drive pulley 36 and idler pulley 38. The drive pulleys 32 and 36 are mounted on a driving shaft 40 which is rotatably driven by a motor (not shown) which is controlled by the control board 28. The conveyor 16 is mounted within the machine 10 so that the work carried thereby is moved slightly upwardly when moving in the direction of arrow 42 from the input side 12 to the soldering station 18. In the embodiment described, the right and left endless chains 16-1 and 16-2 are like bicycle chains as shown by right endless chain 16-1 shown in more detail in FIG. 2. The right chain 16-1 has supports 44 extending therefrom to support a work to be soldered, and similarly, the left chain 16-2 has corresponding supports 46. The pulleys 36 and 38, for example, are axially, as shown by dashed circles 36' and 38' adjustably mounted on their respective shafts 40 and 48 to enable the conveyor 16 to accommodate different widths of work, like the circuit board 14.

Figure 3:
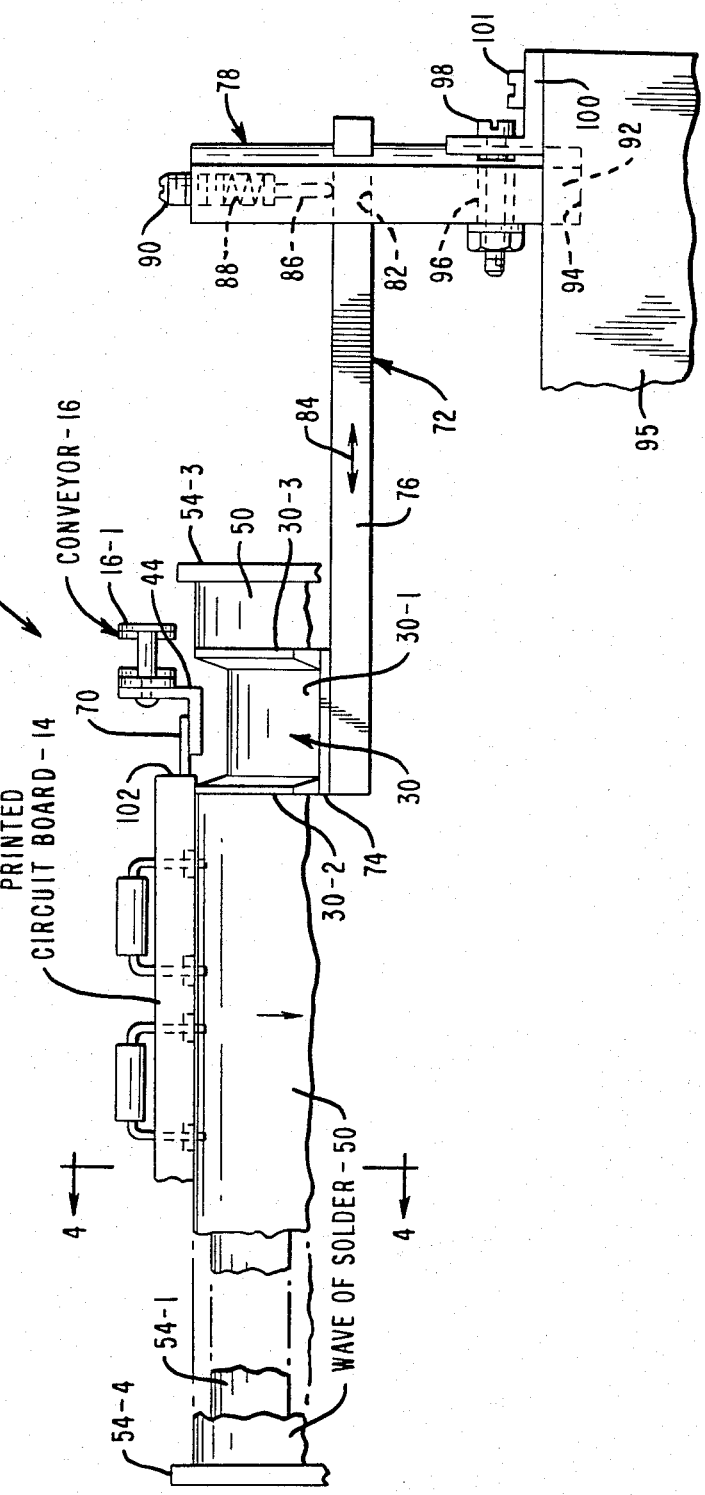
FIG. 3 is a general view, taken along the line 3—3 of FIG. 1, showing the apparatus of this invention as it is oriented in the machine at the soldering station thereof.

The right, endless chain 16-1 is also shown in FIG. 3 which is a view looking downstream at the soldering station 18, showing the wave 50 of molten solder coming directly at the viewer. In this view, the circuit board 14 moves in a direction which is perpendicular to the plane of FIG. 3 and away from the viewer.

Figure 4:
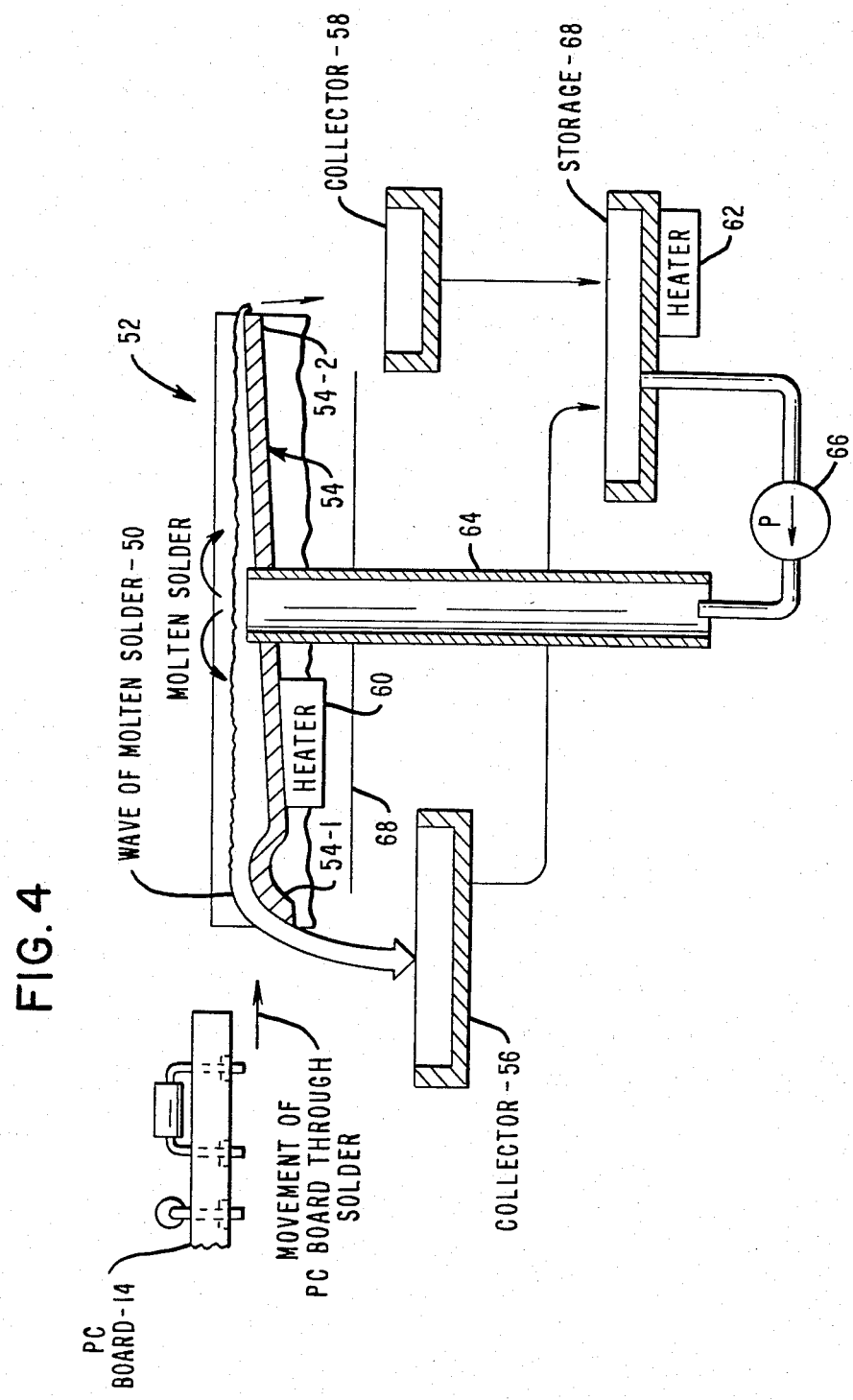
FIG. 4 is a cross-sectional view, taken along the line 4—4 of FIG. 3, showing additional details of the wave soldering machine.

The wave 50 of molten solder is obtained from apparatus which is shown in FIG. 4. Because the means 52 for presenting the wave 50 of molten solder is conventional, it is shown only diagrammatically. The presenting means 52 includes a distributing pan 54, various collectors 56 and 58, heaters like 60 and 62, a delivery conduit 64, and a pump 66. The distributing pan 54 has a front lip 54-1 which is arcuately shaped to provide the surface over which the wave 50 of molten solder is presented. The distributing pan 54 is tilted slightly with respect to a horizontal reference line shown by line 68 so that a sufficient amount of molten solder travels over front lip 54-1 to provide an adequate depth for soldering the circuit board 14. In the embodiment described, a slight amount of molten solder flowing over the rear lip 54-2 of the distributing pan 54 into the collector 58 indicates that there is an adequate depth of molten solder passing over the front lip 54-1. The wave 50 of molten solder passing over the front lip 54-1 is collected in the collector 56 and is transferred to storage 68, and correspondingly, the slight amount of molten solder passing over the rear lip 54-2 is collected in the collector 58 and transferred to the storage tank 68. From the storage tank 68, the molten solder is pumped by the pump 66 upwardly through the conduit 64 into the distributing pan 54. There are conventional heaters like 60 and 62 which are positioned within the producing means 52 to maintain the solder in a molten state. The actual structure for the producing means 52 may differ from that shown in FIG. 4 which is only a diagrammatic showing; however, because this aspect is conventional, it need not be shown in any further detail.

The distributing pan 54 also has the side walls 54-3 and 54-4 shown in FIG. 3 to maintain the solder therein and to restrain the wave 50 of molten solder. The left conveyor chain 16-2 is not shown in FIG. 3 in order to simplify the drawing; however the left side of the circuit board 14 (as viewed in FIG. 3) is supported on supports 46 of the left chain 16-2, and the right side of the circuit board 14 is supported by the supports 44 of the right conveyor chain 16-1.

Having described the details of the soldering station 18, it now appears appropriate to discuss the details of the soldering mask 30 itself, the parts of the work like circuit board 14 which are to be free of solder, and the relationship of the work and the soldering mask 30 to the soldering station 18.

The soldering mask 30 (FIG. 2) has a general, trough-like shape as alluded to earlier herein, and it includes a base portion 30-1 and side portions or side walls 30-2 and 30-3 which are upstanding from the base portion 30-1. The base portion 30-1 is generally, arcuately-shaped so that it generally conforms to the wave 50 of molten solder as viewed from FIG. 4. In the embodiment described, the soldering mask 30 has a length of about 7 inches long and a width of about one and a half inches. Naturally, the dimensions of the mask 30 are dependent upon the particular application in which it is used. In this regard, for example, the width of the base portion 30-1 (as viewed in FIG. 3) is wider than the contacts 70 which represent the portion of the circuit board 14 which is to be free of solder as the circuit board 14 passes through the wave 50 of molten solder. In the embodiment described, the contacts 70 are the gold contacts associated with the printed circuit board 14 which enable it to be coupled to a connector for an electrical connection. It was these contacts 70 which were previously taped to prevent the adherence of solder thereto as described earlier in the Background of the Invention. In the embodiment described, the soldering mask is made of titanium plate material of about 0.070 inch thick. The side walls 30-2 and 30-3 are machined to a thickness of about 0.035 inch prior to folding them at right angles to the base portion 30-1 as shown in FIG. 2. The edges of the side walls 30-2 and 30-3 which are close to the extension 74 are tapered to minimize the circuit board 14 abutting thereagainst as the circuit board 14 approaches the side walls 30-2 and 30-3. In the embodiment described, the soldering mask 30 and the extension 74 are made of the same material, with the mask 30 and the extensions being made from a single piece of titanium.

The means 72 for positioning the soldering mask 30 at the soldering station 18 is seen in FIGS. 2 and 3. The soldering mask and the positioning means 72 form a general "L" shaped configuration as seen best in FIG. 2. The positioning means 72 includes an extension 74 which may be integrally formed with the soldering mask 30, an adjusting rod 76, and an adjusting member 78. The extension 74 is secured to the adjusting rod 76 by fasteners 80. The adjusting member 78 has a quadrilaterally-shaped hole 82 therein to slidably receive the adjusting rod 76 when it is reciprocated in the directions of double arrow 84 to enable the soldering mask to be positioned at the soldering station 18. A plunger 86 (FIG. 3), slidably mounted in the adjusting member 78, is resiliently biased into engagement with the adjusting rod 76 by a compression spring 88 and a fastener 90 which is used to increase the biasing force of the spring 88 by advancing the fastener 90 inwardly. The adjusting member 78 also has an arcuately-shaped bottom 92 (FIG. 3) which is received in a complementary recess 94 in the frame member 95 of the machine 10 to enable the adjusting member 78 to be pivoted or "rocked" slightly to enable the position of the soldering mask 30 to be adjusted relative to the wave 50 of molten solder. The adjusting member 78 has an arcuately-shaped recess 96 therein (FIG. 2) through which a locking screw 98 passes to secure the adjusting member 78 in an adjusted position. The locking screw 98 is mounted in a right angle bracket 100 which is secured to the frame member 95 by a fastener 101.

When several printed circuit boards 14, are to be soldered, for example, the conveyor 16 is adjusted (if necessary) to accept the boards 14. In this regard the left endless chain 16-2 is moved towards or away from the right endless chain 16-1 so that the portion of the work (contacts 70 in this example) which is to be free of solder is positioned relative to the soldering mask 30 as shown in FIG. 3. The gold contacts 70 are supported on the supports 44, and the end 102 (FIG. 3) of the circuit board 14 is positioned over the side wall 30-2 as shown in FIG. 3. The soldering mask 30 displaces the wave 50 of molten solder around contacts 70 to enable the contacts 70 to pass through the wave 50 of molten solder without getting solder thereon. In the embodiment described, the wave soldering machine may be a "Century 2000 S" wave soldering machine which is available from the Electrovert Company of Texas. Because the positioning means 72 for the soldering mask 30 is located close to the opening 26 (FIG. 1) of the soldering machine 10, adjustments can be made relatively safely, by an operator.

What is claimed is:

1. A wave soldering machine comprising:
   a soldering station having means for presenting a wave of molten solder for soldering operations;
   transporting means for transporting work to be soldered along a feeding line into operative contact with said wave of molten solder;
   said work having at least one portion which is to be free of operative contact with said wave of molten solder as said work is moved through said soldering station by said transporting means;
   a soldering mask; and
   positioning means for positioning said soldering mask between said wave of molten solder and said one portion of said work;
   said soldering mask having a general trough-like shape which displaces said wave of molten solder to enable said one portion of said work to be moved through said soldering mask and said soldering station free of operative contact with said wave of molten solder.

2. The wave soldering machine as claimed in claim 1 in which said soldering mask is made of titanium.

3. The wave soldering machine as claimed in claim 1 in which said transporting means includes a conveyor having support members secured thereto for supporting said work including said one portion of said work; said soldering mask being positioned parallel to said feeding line to enable said one portion of said work to be moved through said soldering station free of operative contact with said wave of molten solder.

4. A wave soldering machine comprising:
   a soldering station having means for presenting a wave of molten solder for soldering operations;
   transporting means for transporting work to be soldered along a feeding line into operative contact with said wave of molten solder;
   said work having at least one portion which is to be free of operative contact with said wave of molten solder as said work is moved through said soldering station by said transporting means;
   a soldering mask; and
   positioning means for positioning said soldering mask between said wave of molten solder and said one portion of said work;
   said soldering mask having a general trough-like shape which displaces said wave of molten solder to enable said one portion of said work to be moved through said soldering station free of operative contact with said wave of molten solder;
   said transporting means including a conveyor having support members secured thereto for supporting said work including said one portion of said work; said soldering mask being positioned parallel to said feeding line to enable said one portion of said work to be moved through said soldering station free of operative contact with said wave of molten solder;
   said soldering mask having a base portion and first and second side walls upstanding from said base portion;
   said base portion being generally arcuately shaped to conform to the shape of said wave of molten solder.

5. The wave soldering machine as claimed in claim 4 in which said soldering mask is made of titanium.

6. The wave soldering machine as claimed in claim 5 in which said positioning means includes adjusting means for adjustably positioning said soldering mask between said wave of molten solder and said one portion of said work.

7. The wave soldering machine as claimed in claim 6 in which said adjusting means includes means for positioning said soldering mask towards and away from said feeding line.

8. The wave soldering machine as claimed in claim 6 in which said work is a printed circuit board and said one portion is at least one plug-in contact.

9. A soldering mask for use with a wave soldering machine which presents a wave of molten solder for soldering operations and which also includes transporting means for transporting work to be soldered along a feeding line into operative contact with said wave of molten solder;
   said soldering mask to be used to enable a portion of said work to be moved through said wave of molten solder free of operative contact with said wave of molten solder;
   said soldering mask comprising:
   a base portion and first and second side walls upstanding therefrom to form a general trough-like shape;
   said base portion being generally arcuately shaped to conform to the shape of said wave of molten solder; and
   positioning means to enable said soldering mask to be positioned between said portion of said work and said wave of molten solder.

10. The soldering mask as claimed in claim 9 in which at least said base portion and said first and second side walls are made of titanium.

11. The soldering mask as claimed in claim 10 in which said soldering mask and said positioning means form a general "L"-shaped configuration.

12. In a wave soldering machine which presents a wave of molten solder for soldering operations and which included transporting means for transporting work to be soldered along a feeding direction into operative contact with said wave of solder; said work having at least one portion which is to be free of operative contact with said wave of molten solder;
    the method of soldering said work and keeping said one portion free of operative contact with said wave of method solder comprising the steps:
    (a) positioning said one portion of said work on a support of said transporting means to be moved in a direction parallel to said feeding direction toward said wave of molten solder; and
    (b) positioning a trough-like soldering mask parallel to said feeding direction so as to displace said wave of molten solder at the area of said support to enable said one portion of said work to be moved through said trough-like soldering mask and said wave of molten solder free of operative contact with said wave of molten solder.

* * * * *